United States Patent
Yokawa et al.

(10) Patent No.: US 9,329,434 B2
(45) Date of Patent: May 3, 2016

(54) DISPLAY WITH HEAT RADIATION

(71) Applicant: Funai Electric Co., Ltd., Daito-shi (JP)

(72) Inventors: Akira Yokawa, Daito (JP); Yuki Kita, Daito (JP); Akihiro Fujikawa, Daito (JP); Yasuyuki Fukumoto, Daito (JP); Yasuhiro Mori, Daito (JP); Yuto Suzuki, Daito (JP); Hirofumi Horiuchi, Daito (JP); Hirohiko Tsuji, Daito (JP); Takahito Yamanaka, Daito (JP); Hideo Yonezawa, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 614 days.

(21) Appl. No.: 13/649,302

(22) Filed: Oct. 11, 2012

(65) Prior Publication Data

US 2013/0093959 A1    Apr. 18, 2013

(30) Foreign Application Priority Data

Oct. 12, 2011    (JP) ................................. 2011-224559

(51) Int. Cl.
| | |
|---|---|
| G02F 1/1335 | (2006.01) |
| H05K 7/20 | (2006.01) |
| G06F 1/20 | (2006.01) |
| H05K 1/02 | (2006.01) |

(Continued)

(52) U.S. Cl.
CPC ........ G02F 1/133615 (2013.01); G02B 6/0085 (2013.01); G06F 1/20 (2013.01); H05K 1/0209 (2013.01); H05K 7/20963 (2013.01); G02B 6/0068 (2013.01); G02B 6/0073 (2013.01); G02F 2001/133314 (2013.01); G02F 2001/133317 (2013.01); G02F 2001/133328 (2013.01); G02F 2001/133628 (2013.01); H05K 2201/0162 (2013.01); H05K 2201/09909 (2013.01)

(58) Field of Classification Search
CPC ...................... G02F 1/133615; H05K 7/20963
USPC ......................................................... 348/725
See application file for complete search history.

(56) References Cited

U.S. PATENT DOCUMENTS

| 7,667,782 B2 | 2/2010 | Iwai et al. |
|---|---|---|
| 7,894,016 B2 | 2/2011 | Hamada |

(Continued)

FOREIGN PATENT DOCUMENTS

| EP | 1 881 360 A2 | 1/2008 |
|---|---|---|
| EP | 1 942 367 A2 | 7/2008 |

(Continued)

OTHER PUBLICATIONS

Extended European Search Report dated Jan. 21, 2013 (nine (9) pages).

*Primary Examiner* — Tung Vo
*Assistant Examiner* — Rowina Cattungal
(74) *Attorney, Agent, or Firm* — Crowell & Moring LLP (57) ABSTRACT

This display includes a light source portion, a first heat radiation member for radiating heat generated by the light source portion, a rear housing covering the first heat radiation member in a state in contact with the first heat radiation member, and a cover member covering a rear surface of the rear housing so that the rear surface of the rear housing is partially exposed outward. The first heat radiation member is arranged on a region corresponding to a region of the rear housing exposed outward from the cover member as viewed from the side of the rear surface.

19 Claims, 10 Drawing Sheets

(51) Int. Cl.
*F21V 8/00* (2006.01)
*G02F 1/1333* (2006.01)

(56) References Cited

U.S. PATENT DOCUMENTS

| | | | |
|---|---|---|---|
| 7,978,286 B2 | 7/2011 | Kono et al. | |
| 8,576,355 B2 | 11/2013 | Hosoki | |
| 8,811,017 B2 | 8/2014 | Fujii et al. | |
| 2006/0012962 A1* | 1/2006 | Obata | 361/704 |
| 2006/0103774 A1 | 5/2006 | Han et al. | |
| 2006/0146223 A1* | 7/2006 | Iwai | G02F 1/133308 349/58 |
| 2006/0243948 A1* | 11/2006 | Ishiwa | G02B 6/0085 252/299.61 |
| 2009/0096957 A1 | 4/2009 | Hiyama et al. | |
| 2011/0141697 A1 | 6/2011 | Fujii et al. | |
| 2011/0235286 A1* | 9/2011 | Kitayama et al. | 361/749 |
| 2014/0347620 A1 | 11/2014 | Fujii et al. | |

FOREIGN PATENT DOCUMENTS

| | | |
|---|---|---|
| EP | 2 390 712 A1 | 11/2011 |
| JP | 2005-84270 A | 3/2005 |
| JP | 3108915 U | 4/2005 |
| JP | 2005-345855 A | 12/2005 |
| JP | 2006-208485 A | 8/2006 |
| JP | 2006-267936 A | 10/2006 |
| JP | 2008-130413 A | 6/2008 |
| JP | 2009-98310 A | 5/2009 |
| JP | 2010-9787 A | 1/2010 |
| JP | 2010-54718 A | 3/2010 |
| JP | 2010-113196 A | 5/2010 |
| JP | 2011-180287 A | 9/2011 |
| JP | 2011-187312 A | 9/2011 |
| KR | 10-1054767 B1 | 8/2011 |
| WO | WO 2007/129419 A1 | 11/2007 |
| WO | WO 2011/083634 A1 | 7/2011 |

* cited by examiner

DISPLAY WITH HEAT RADIATION

BACKGROUND OF THE INVENTION

1. Field of the Invention

The present invention relates to a display and a television set, and more particularly, it relates to a display and a television set each including a heat radiation member for radiating heat generated by a light source portion.

2. Description of the Background Art

A display including a heat radiation member for radiating heat generated by a light source portion is known in general, as disclosed in Japanese Patent Laying-Open No. 2008-130413, for example.

The aforementioned Japanese Patent Laying-Open No. 2008-130413 discloses a liquid crystal display including a liquid crystal panel, a light guide arranged at the back of the liquid crystal panel, an LED (light source portion) arranged on a side portion of the light guide, a reflection sheet arranged at the back of the light guide, a back case (heat radiation member) arranged at the back of the LED and the reflection sheet and a heat sink arranged at the back of the back case for functioning as a rear housing. In this liquid crystal display, the back case is arranged to cover the whole of a region where the LED and the reflection sheet are arranged in a state in contact with the LED and the reflection sheet. The heat sink (rear housing) at the back of the back case is arranged to cover the whole of a region where the back case is arranged. In other words, the back case covering the LED and the reflection sheet is arranged on a region substantially equal to that where the heat sink (rear housing) is arranged as viewed from behind in the aforementioned liquid crystal display. The aforementioned liquid crystal display is so formed that the heat sink (rear housing) radiates heat generated by the LED through the back case in a normal use state.

In the liquid crystal display described in the aforementioned Japanese Patent Laying-Open No. 2008-130413, however, the back case (heat radiation member) radiating the heat generated by the LED is arranged on the region substantially equal to that where the heat sink (rear housing) is arranged as viewed from behind, and hence the area of the region where the back case is arranged is disadvantageously increased.

SUMMARY OF THE INVENTION

The present invention has been proposed in order to solve the aforementioned problem, and an object of the present invention is to provide a display and a television set each capable of reducing the area of a region where a heat radiation member is arranged while excellently radiating heat generated by a light source portion.

A display according to a first aspect of the present invention includes a light source portion, a first heat radiation member arranged in a state in contact with the light source portion for radiating heat generated by the light source portion, a rear housing arranged to cover the first heat radiation member in a state in contact with the first heat radiation member so that a rear surface is partially exposed outward and a cover member covering the rear surface of the rear housing so that the rear surface of the rear housing is partially exposed outward, while the first heat radiation member is arranged on a region corresponding to a region of the rear housing exposed outward from the cover member as viewed from the side of the rear surface.

In the display according to the first aspect, as hereinabove described, the first heat radiation member is arranged on the region corresponding to the region of the rear housing exposed outward from the cover member as viewed from the side of the rear surface, whereby heat generated by the light source portion can be excellently radiated from the outwardly exposed region of the rear housing through the first heat radiation member, dissimilarly to a case where the first heat radiation member is arranged on a region corresponding to a region of the rear housing covered with the cover member as viewed from the side of the rear surface. Further, the area of the region where the first heat radiation member is arranged can be reduced dissimilarly to a case where the first heat radiation member is arranged on a region substantially equal to a region where the rear housing is arranged, for example. Thus, the area of the region where the first heat radiation member is arranged can be reduced while excellently radiating the heat generated by the light source portion.

In the aforementioned display according to the first aspect, the light source portion is preferably mounted on the first heat radiation member, and the first heat radiation member mounted with the light source portion is preferably arranged on the region corresponding to the region of the rear housing exposed outward from the cover member as viewed from the side of the rear surface of the rear housing. According to this structure, the distance between the light source portion mounted on the first heat radiation member and the outwardly exposed region of the rear housing can be relatively reduced, whereby the heat generated by the light source portion can be quickly radiated from the outwardly exposed region of the rear housing through the first heat radiation member.

In the aforementioned display according to the first aspect, a surface of the first heat radiation member closer to the rear housing is preferably arranged to be in surface contact with an inner surface of the rear housing. According to this structure, heat radiation can be more effectively performed as compared with a case where the surface of the first heat radiation member closer to the rear housing is arranged to be in point contact or in line contact with the inner surface of the rear housing.

In this case, the first heat radiation member preferably has a first projecting portion protruding toward the inner surface of the rear housing, and a surface of the first projecting portion of the first heat radiation member is preferably arranged to be in surface contact with the inner surface of the rear housing. According to this structure, the first projecting portion can easily and more effectively radiate the heat.

In the aforementioned display including the first heat radiation member having the first projecting portion, both of the surface of the first projecting portion of the first heat radiation member and a portion of the inner surface of the rear housing corresponding to the surface of the first projecting portion are preferably in the form of planar surfaces. According to this structure, the surface of the first projecting portion of the first heat radiation member and the portion of the inner surface of the rear housing corresponding to the surface of the first projecting portion can be easily brought into surface contact with each other.

In the aforementioned display including the first heat radiation member having the first projecting portion, the rear housing is preferably rectangularly formed and so provided that a portion around an outer peripheral portion is exposed outward from the cover member, and a region where the surface of the first projecting portion of the first heat radiation member and the inner surface of the rear housing are in surface contact with each other is preferably arranged in the vicinity of one side constituting the outer peripheral portion of the rectangularly formed rear housing to extend along this side. According to this structure, the region where the surface of the first projecting portion of the first heat radiation member and the inner surface of the rear housing are in surface contact with each other is arranged to extend along one side so that the heat radiation area can be increased, whereby heat radiation can be more effectively performed.

In the aforementioned display in which the surface of the first heat radiation member closer to the rear housing is in surface contact with the inner surface of the rear housing, the first heat radiation member preferably has a second projecting portion protruding toward the inner surface of the rear housing and mounted with a screw member, the rear housing preferably has a recess portion concaved toward the second projecting portion of the first heat radiation member and mounted with the screw member, and a surface of the second projecting portion, mounted with the screw member, of the first heat radiation member and a surface of the recess portion, mounted with the screw member, of the rear housing closer to the first heat radiation member are preferably fixed to each other by the screw member in a state in surface contact with each other. According to this structure, the surface of the second projecting portion of the first heat radiation member and the surface of the recess portion of the rear housing closer to the first heat radiation member can be pressure-welded to each other in the state in surface contact with each other, whereby heat can be rendered more easily conductible, and heat radiation can be more effectively performed.

In this case, both of the surface of the second projecting portion of the first heat radiation member and the surface of the recess portion of the rear housing closer to the first heat radiation member are preferably in the form of planar surfaces. According to this structure, the surface of the second projecting portion of the first heat radiation member and the surface of the recess portion of the rear housing closer to the first heat radiation member can be easily brought into surface contact with each other.

In the aforementioned display including the first heat radiation member having the second projecting portion, the first heat radiation member preferably has a first projecting portion protruding toward the inner surface of the rear housing, a surface of the first projecting portion of the first heat radiation member is preferably arranged to be in surface contact with the inner surface of the rear housing, and a protrusion height of the first projecting portion with respect to a surface of the first heat radiation member is preferably larger than a protrusion height of the second projecting portion with respect to the surface of the first heat radiation member. According to this structure, the surface of the first projecting portion of the first heat radiation member and the portion of the inner surface of the rear housing corresponding to the surface of the first projecting portion come into surface contact with each other on a vertical position higher than that of the second projecting portion, whereby the surface of the first projecting portion of the first heat radiation member and the portion of the inner surface of the rear housing corresponding to the surface of the first projecting portion can be easily brought into surface contact with each other while pressure-welding the surface of the second projecting portion and the surface of the recess portion of the rear housing closer to the first heat radiation member to each other in the surface contact state.

In the aforementioned display according to the first aspect, the light source portion preferably includes a backlight LED source. According to this structure, heat generated by the backlight LED source can be excellently radiated from the outwardly exposed region of the rear housing through the first heat radiation member.

The aforementioned display according to the first aspect preferably further includes a circuit board including a heating element mounted on a portion of the rear surface of the rear housing covered with the cover member, and a second heat radiation member arranged between the circuit board and the rear housing for radiating heat generated by the heating element of the circuit board to the rear housing. According to this structure, the heat generated by the heating element can be easily radiated from the outwardly exposed region of the rear housing through the second heat radiation member also when the circuit board mounted with the heating element is covered with the cover member.

In this case, a third projecting portion protruding toward an inner surface of the cover member is preferably formed on a region of the rear surface of the rear housing corresponding to the heating element of the circuit board while the circuit board is preferably arranged on a surface of the third projecting portion through the second heat radiation member, and the display is preferably so formed that heat generated by the heating element of the circuit board covered with the cover member is indirectly radiated from the outwardly exposed region of the rear housing through the second heat radiation member and the third projecting portion of the rear housing. According to this structure, the thickness of the second heat radiation member can be reduced by the height of the third projecting portion formed on the rear housing while the heat generated by the heating element is indirectly radiated from the outwardly exposed region of the rear housing through the second heat radiation member and the third projecting portion of the rear housing, whereby the heat generated by the heating element can be easily radiated.

In the aforementioned display in which the third projecting portion is formed on the rear surface of the rear housing, a surface of the third projecting portion closer to the circuit board is preferably in the form of a planar surface. According to this structure, the second heat radiation member can be easily fixed by arranging the second heat radiation member in a clearance between the surface of the third projecting portion, provided in the form of a planar surface, closer to the circuit board and the circuit board to be held therebetween.

In the aforementioned display in which the third projecting portion is formed on the rear surface of the rear housing, the rear housing preferably has a board mounting portion protruding toward the circuit board so that the circuit board is fixed thereto, and a protrusion height of the board mounting portion with respect to the rear surface of the rear housing is preferably larger than a protrusion height of the third projecting portion with respect to the rear surface of the rear housing. According to this structure, the circuit board is fixed on a vertical position higher than that of the third projecting portion, whereby the second heat radiation member can be easily arranged in the clearance between the surface of the third projecting portion closer to the circuit board and the circuit board to be held therebetween.

In the aforementioned display according to the first aspect, the first heat radiation member and the rear housing are preferably made of metal. According to this structure, the heat generated by the light source portion or the heating element can be rendered easily conductible, whereby heat radiation efficiency can be improved.

A television set according to a second aspect of the present invention includes a receiving portion capable of receiving television broadcasting, a light source portion, a first heat radiation member arranged in a state in contact with the light source portion for radiating heat generated by the light source portion, a rear housing arranged to cover the first heat radiation member in a state in contact with the first heat radiation member so that a rear surface is partially exposed outward and a cover member covering the rear surface of the rear housing so that the rear surface of the rear housing is partially exposed outward, while the first heat radiation member is arranged on a region corresponding to a region of the rear housing exposed outward from the cover member as viewed from the side of the rear surface.

In the television set according to the second aspect, as hereinabove described, the first heat radiation member is arranged on the region corresponding to the region of the rear housing exposed outward from the cover member as viewed from the side of the rear surface, whereby heat generated by the light source portion can be excellently radiated from the outwardly exposed region of the rear housing through the first heat radiation member, dissimilarly to a case where the first heat radiation member is arranged on a region corresponding to a region of the rear housing covered with the cover member as viewed from the side of the rear surface. Further, the area of the region where the first heat radiation member is arranged can be reduced dissimilarly to a case where the first heat radiation member is arranged on a region substantially equal to a region where the rear housing is arranged, for example. Thus, a television set capable of reducing the area of the region where the first heat radiation member is arranged while excellently radiating the heat generated by the light source portion can be provided.

In the aforementioned television set according to the second aspect, the light source portion is preferably mounted on the first heat radiation member, and the first heat radiation member mounted with the light source portion is preferably arranged on the region corresponding to the region of the rear housing exposed outward from the cover member as viewed from the side of the rear surface of the rear housing. According to this structure, the distance between the light source portion mounted on the first heat radiation member and the outwardly exposed region of the rear housing can be relatively reduced, whereby the heat generated by the light source portion can be quickly radiated from the outwardly exposed region of the rear housing through the first heat radiation member.

In the aforementioned television set according to the second aspect, a surface of the first heat radiation member closer to the rear housing is preferably arranged to be in surface contact with an inner surface of the rear housing. According to this structure, heat radiation can be more effectively performed as compared with a case where the surface of the first heat radiation member closer to the rear housing is arranged to be in point contact or in line contact with the inner surface of the rear housing.

In this case, the first heat radiation member preferably has a first projecting portion protruding toward the inner surface of the rear housing, and a surface of the first projecting portion of the first heat radiation member is preferably arranged to be in surface contact with the inner surface of the rear housing. According to this structure, the first projecting portion can easily and more effectively radiate the heat.

In the aforementioned television set including the first heat radiation member having the first projecting portion, both of the surface of the first projecting portion of the first heat radiation member and a portion of the inner surface of the rear housing corresponding to the surface of the first projecting portion are preferably in the form of planar surfaces. According to this structure, the surface of the first projecting portion of the first heat radiation member and the portion of the inner surface of the rear housing corresponding to the surface of the first projecting portion can be easily brought into surface contact with each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

The structure of a liquid crystal television set 100 according to the embodiment of the present invention is described with reference to FIGS. 1 to 12. The liquid crystal television set 100 is an example of the "display" or the "television set" in the present invention.

Figure 1:
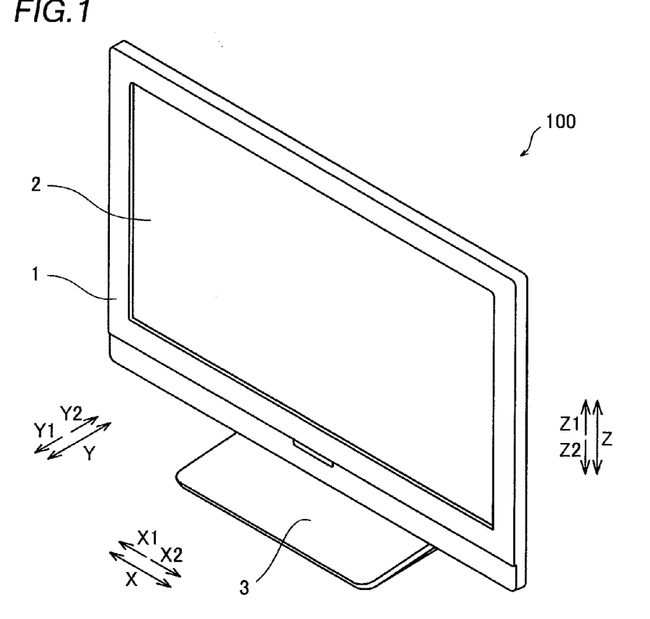
FIG. 1 is an overall perspective view of a liquid crystal television set according to an embodiment of the present invention as viewed from front.
Figure 2:
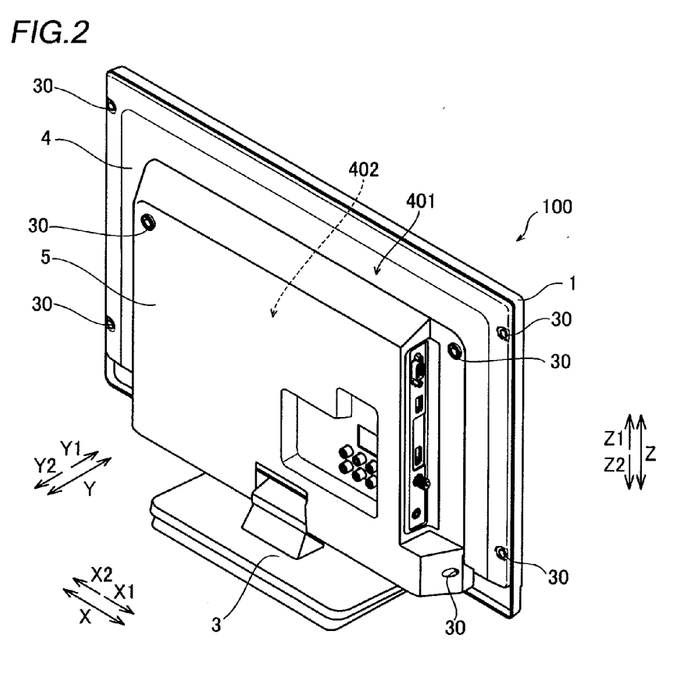
FIG. 2 is an overall perspective view of the liquid crystal television set according to the embodiment of the present invention as viewed from behind.

The liquid crystal television set 100 according to the embodiment of the present invention has a rectangular shape, and includes a frame-shaped front housing 1, a liquid crystal cell 2 stored in the front housing 1 and a stand member 3 supporting the overall liquid crystal television set 100, as shown in FIGS. 1 and 2. Both of the front housing 1 and the stand member 3 are made of resin.

Figure 3:
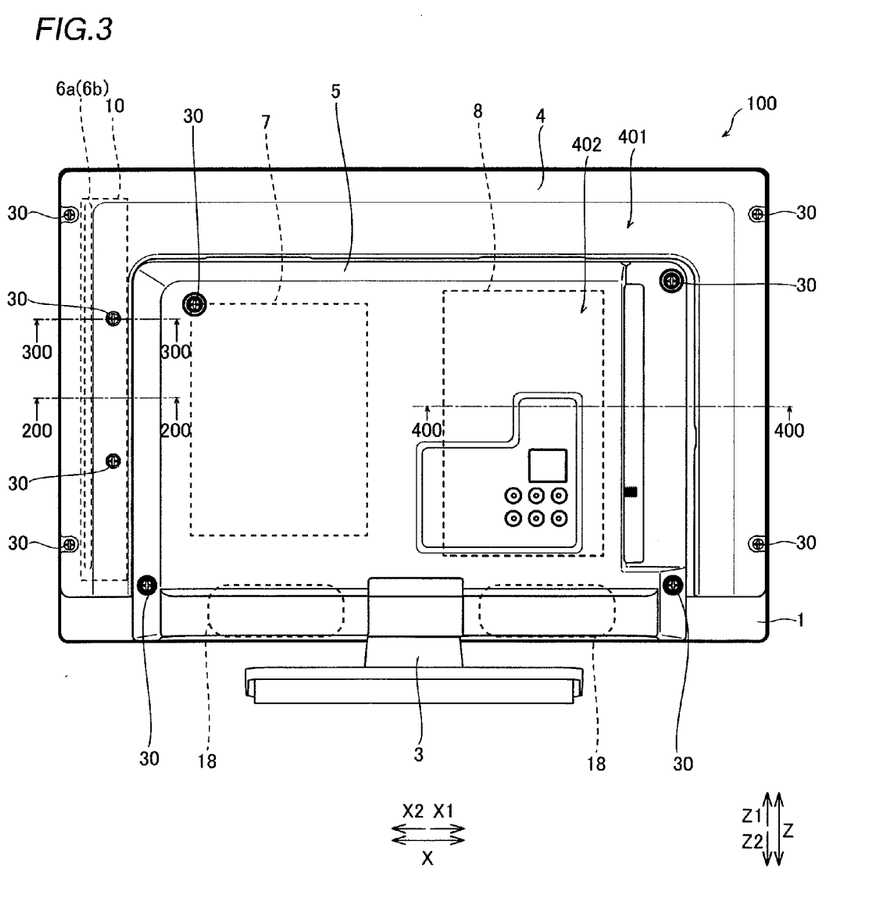
FIG. 3 is a back elevational view (rear elevational view) of the liquid crystal television set according to the embodiment of the present invention.

A metal rear housing 4 made of sheet metal (SECC: electrolytic zinc-plated steel) is arranged on the side (along arrow Y2) of the rear surface of the front housing 1, as shown in FIGS. 2 and 3. The rear housing 4 has a rectangular shape and is formed to be smaller than the front housing 1 as viewed from behind, as shown in FIG. 3.

A cover member 5 made of resin is mounted on the rear surface of the metal rear housing 4. The cover member 5 has a rectangular shape and is formed to be smaller than the front housing 1 and the rear housing 4 as viewed from behind.

The cover member 5 covers the rear surface of the rear housing 4 so that a portion around an outer peripheral surface of the rear surface (back surface) of the rear housing 4 is exposed in an inverted U-shaped manner as viewed from behind. An outwardly exposed region 401 of the rear housing 4 is formed to function as a heat radiation portion radiating heat generated by an LED source 6a and a heating element 81 (see FIG. 4) of a circuit board 8.

Figure 4:
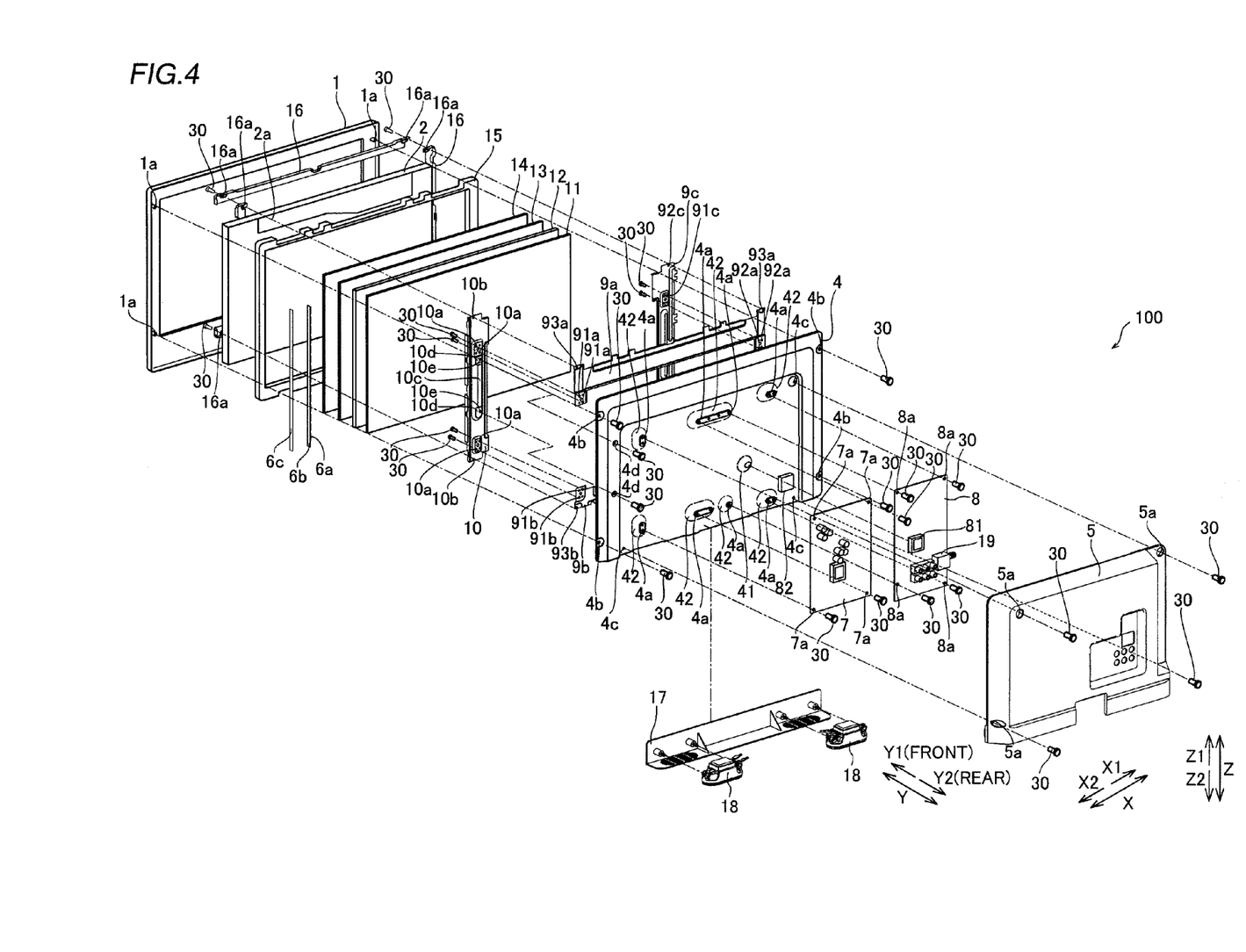
FIG. 4 is an exploded perspective view of the liquid crystal television set according to the embodiment of the present invention.

As shown in FIGS. 3 and 4, a circuit board 7 having a function of supplying power to the overall liquid crystal television set 100 and the circuit board 8 performing signal processing are mounted on a region 402 of the rear surface of the rear housing 4 mounted with the cover member 5, to align with each other at a prescribed interval in a direction X. The heating element 81 such as an IC generating heat in a normal use state is mounted on the circuit board 8.

A thermal pad mounting portion 41 protruding toward the inner surface of the cover member 5 is formed on a region of the rear surface (along arrow Y2) of the rear housing 4 corresponding to the heating element 81 of the circuit board 8. The thermal pad mounting portion 41 is an example of the "third projecting portion" in the present invention. A thermal pad 82 for radiating heat generated by the heating element 81 toward the side of the rear housing 4 is arranged between the thermal pad mounting portion 41 of the rear housing 4 and the heating element 81 of the circuit board 8 to be held therebetween. The thermal pad 82 is an example of the "second heat radiation member" in the present invention. The thermal pad 82 is made of a mixed material of silicone polymer and ceramic or the like.

A reflection sheet holder 9a made of sheet metal (SECC), another reflection sheet holder 9b, still another reflection sheet holder 9c and a heat sink 10 made of sheet metal (SECC) are arranged in front of the rear housing 4 (along arrow Y1). A reflection sheet 11, a light guide 12, a light diffusion sheet 13, a lens sheet 14, a frame-shaped resin frame 15, the liquid crystal cell 2 mounted with a liquid crystal cell driving board 2a driving the liquid crystal cell 2 and four bezels 16 are arranged in front of the reflection sheet holders 9a, 9b and 9c and the heat sink 10 (along arrow Y1). The heat sink 10 is an example of the "first heat radiation member" in the present invention.

Figure 8:
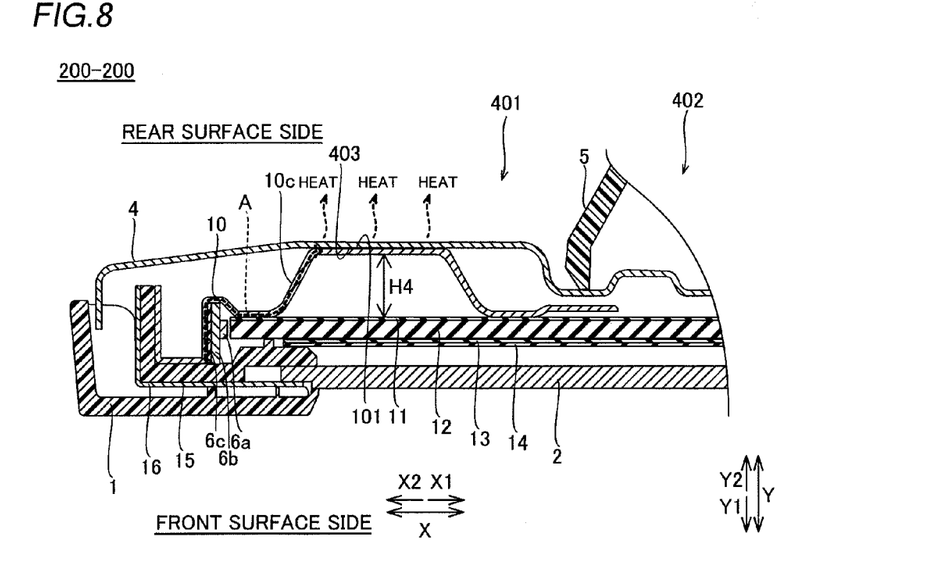
FIG. 8 is a sectional view taken along the line 200-200 in FIG. 3.
Figure 9:
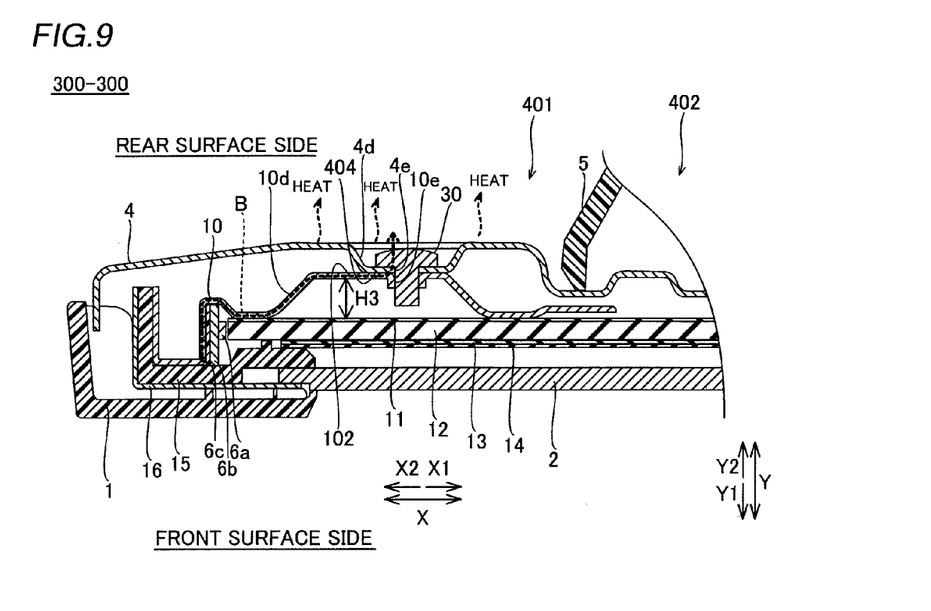
FIG. 9 is a sectional view taken along the line 300-300 in FIG. 3.

The backlight LED source 6a constituted of a plurality of LEDs is arranged on a side portion of the light guide 12, as shown in FIGS. 8 and 9. The LED source 6a generates heat in the normal use state of the liquid crystal television set 100. The LED source 6a is mounted on a surface of an LED board 6b along arrow X1. Another surface (opposite to the surface mounted with the LED source 6a) of the LED board 6b along arrow X2 is mounted on a surface of the heat sink 10 along arrow X1 through a heat radiation tape (sheet) 6c. The "light source portion" in the present invention is so constituted as to include the LED source 6a, the LED board 6b and the heat radiation tape 6c.

As shown in FIG. 4, screw receiving holes 10a for mounting the reflection sheet holders 9a and 9b are formed in the heat sink 10. Heat sink mounting threaded holes 91a and 91b for mounting the heat sink 10 are formed on left ends of the reflection sheet holders 9a and 9b respectively. Screws 30 are mounted on the heat sink mounting threaded holes 91a and 91b of the reflection sheet holders 9a and 9b through the screw receiving holes 10a of the heat sink 10 respectively, thereby fixing the heat sink 10 and the reflection sheet holders 9a and 9b to each other.

Figure 6:
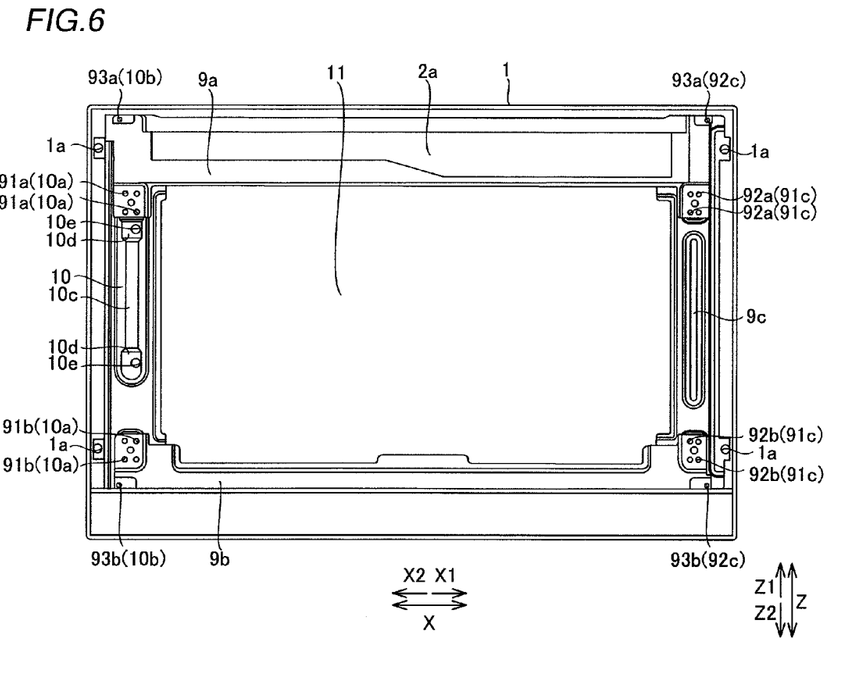
FIG. 6 is a back elevational view (rear elevational view) showing a heat sink, a reflection sheet and a reflection sheet holder of the liquid crystal television set according to the embodiment of the present invention.

Screw receiving holes 10b for mounting the corresponding bezels 16 are formed on upper and lower end portions of the heat sink 10 respectively. As shown in FIG. 6, bezel mounting threaded holes 93a for mounting the corresponding bezel 16 are formed on right and left ends of the reflection sheet holder 9a respectively, while bezel mounting threaded holes 93b for mounting the corresponding bezel 16 are formed on right and left ends of the reflection sheet holder 9b respectively. As shown in FIG. 4, screw receiving holes 16a for mounting screws 30 are formed in the bezels 16. The screws 30 are mounted on the bezel mounting threaded holes 93a and 93b formed on the left ends of the reflection sheet holders 9a and 9b respectively through the screw receiving holes 16a of the bezels 16 and the screw receiving holes 10b of the heat sink 10, thereby fixing the bezels 16, the heat sink 10 and the reflection sheet holders 9a and 9b to each other.

Figure 12:
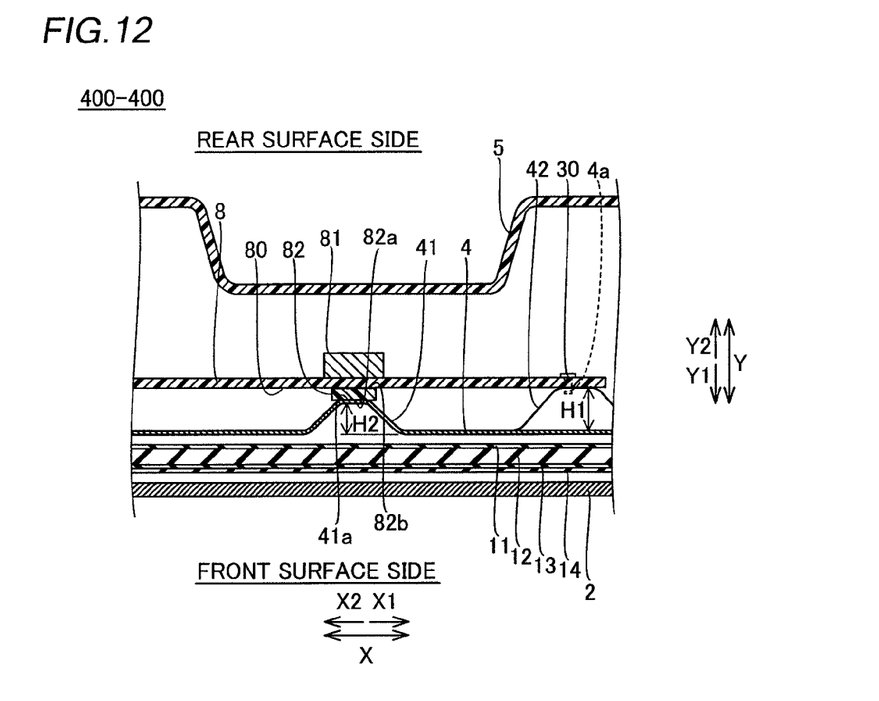
FIG. 12 is a sectional view taken along the line 400-400 in FIG. 3.

A plurality of board mounting portions 42 for mounting the respective ones of the circuit boards 7 and 8 are formed on the rear surface (bottom surface) of the rear housing 4. The plurality of board mounting portions 42 are formed to protrude toward the cover member 5. The plurality of board mounting portions 42 are provided with board mounting threaded holes 4a. As shown in FIG. 12, the height (protrusion height with respect to the rear surface of the rear housing 4) H1 of the board mounting portions 42 of the rear housing 4 is larger than the height (protrusion height with respect to the rear surface of the rear housing 4) H2 of the thermal pad mounting portion 41 of the rear housing 4. All of surfaces of the board mounting portions 42 closer to the circuit board 8 (along arrow Y2) and a surface of the thermal pad mounting portion 41 closer to the circuit board 8 are in the form of planar surfaces.

As shown in FIG. 4, a plurality of screw receiving holes 7a for receiving a plurality of screws 30 are formed on outer edge portions of the circuit board 7. The plurality of screws 30 are mounted on the plurality of board mounting threaded holes 4a of the rear housing 4 through the screw receiving holes 7a of the circuit board 7 respectively, thereby fixing the circuit board 7 to the rear housing 4. Similarly, a plurality of screw receiving holes 8a for receiving a plurality of screws 30 are formed on outer edge portions or the circuit board 8. The plurality of screws 30 are mounted on the plurality of board mounting threaded holes 4a of the rear housing 4 through the screw receiving holes 8a of the circuit board 8 respectively, thereby fixing the circuit board 8 to the rear housing 4.

A plurality of screw receiving holes 4b are formed on the rear surface of the rear housing 4 along outer edge portions. A plurality of screws 30 are mounted on a plurality of rear housing mounting threaded holes 1a of the front housing 1 through the plurality of screw receiving holes 4b of the rear housing 4 respectively, thereby fixing the rear housing 4 to the front housing 1.

A plurality of cover member mounting holes 4c for mounting the cover member 5 are formed on the rear surface of the rear housing 4. A plurality of screw receiving holes 5a are formed in the cover member 5. A plurality of screws 30 are mounted on the plurality of cover member mounting threaded holes 4c of the rear housing 4 through the plurality of screw receiving holes 5a of the cover member 5 respectively, thereby mounting the cover member 5 on the rear housing 4. The screw 30 mounted on the upper left screw receiving hole 5a of the cover member 5 is mounted on the upper left board mounting threaded hole 4a of the rear housing 4 through the upper left screw receiving hole 7a of the circuit board 7 as viewed from behind.

The cover member 5 is mounted on the lower cover member mounting threaded holes 4c formed on the rear surface of the rear housing 4 with the corresponding screws 30, to hold a speaker mounting member 17 therebetween. Two speakers 18 are mounted on the speaker mounting member 17. The cover member 5 is mounted to cover the circuit boards 7 and 8 and the speaker mounting member 17 mounted with the two speakers 18 from behind.

Figure 5:
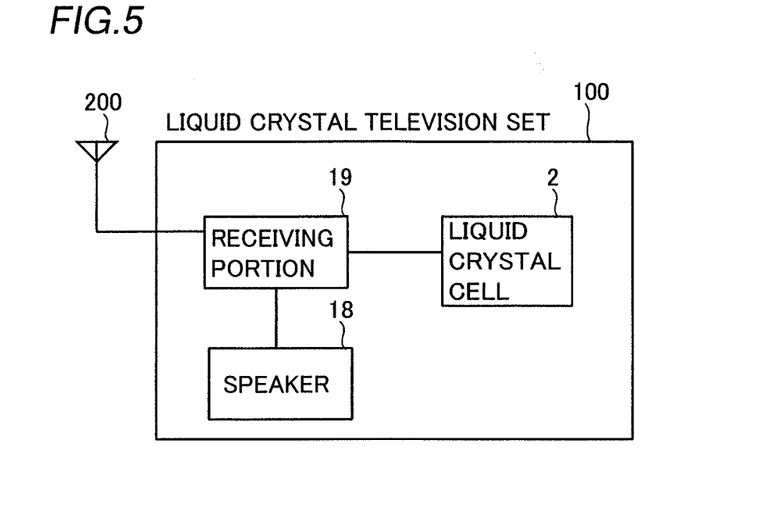
FIG. 5 is a block diagram of the liquid crystal television set according to the embodiment of the present invention.

The signal processing circuit board 8 mounted on the rear housing 4 has a receiving portion (tuner) 19 capable of receiving television broadcasting. In the liquid crystal television set 100, the receiving portion 19 is connected with the liquid crystal cell 2 and the speakers 18 as shown in FIG. 5, and formed to output a picture signal included in television broadcasting signals (the picture signal and a sound signal) received by an antenna 20 to the liquid crystal cell 2 and to output the sound signal to the speakers 18.

As shown in FIGS. 3 and 6, the reflection sheet holders 9a, 9b and 9c are arranged in the vicinity of sides of an outer peripheral portion of the front housing 1 along arrows Z1, Z2 and X1 as viewed from behind respectively. The three reflection sheet holders 9a, 9b and 9c and the heat sink 10 have a function of pressing four sides of the reflection sheet 11 toward the light guide 12. The liquid crystal cell driving board 2a for driving the liquid crystal cell 2 is mounted on the rear surface of the reflection sheet holder 9a arranged in the vicinity of the side of the front housing 1 along arrow Z1.

According to this embodiment, the heat sink 10 is arranged in the vicinity of the side of the rectangular front housing 1 (rear housing 4) along arrow X2 to extend along the side in a direction Z (short-side direction of the front housing 1 (rear housing 4)) as viewed from behind, as shown in FIGS. 3 and 6. Further, the heat sink 10 is arranged on a region (region along arrow X2 in the outwardly exposed region 401) corresponding to the region 401 of the rear housing 4 exposed outward from the cover member 5 as viewed from behind.

As shown in FIG. 6, the heat sink 10 includes a first projecting portion 10c protruding toward the rear housing 4 and two second projecting portions 10d formed at a prescribed interval in the direction Z to hold the first projecting portion 10c therebetween.

Figure 7:
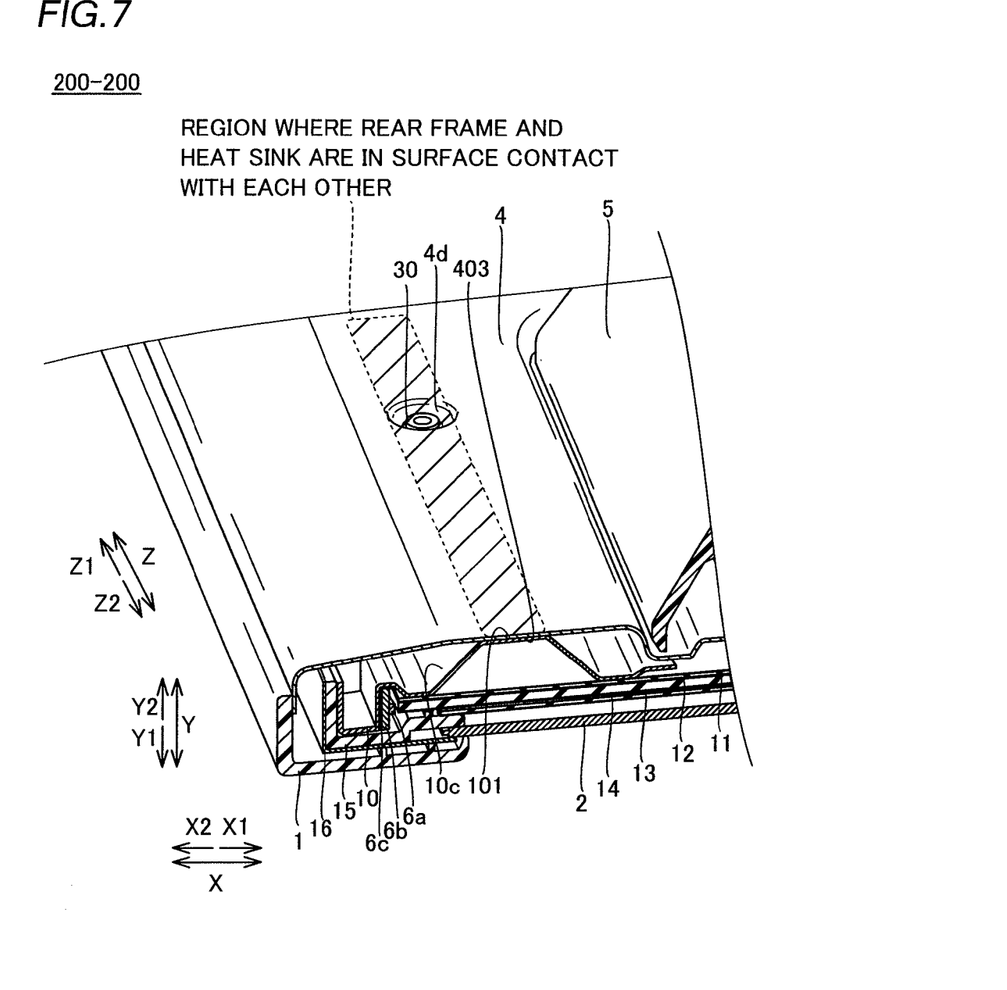
FIG. 7 is a perspective sectional view taken along the line 200-200 in FIG. 3.

As shown in FIGS. 7 and 8, an outer surface 101 of the first projecting portion 10c of the heat sink 10 is in the form of a planar surface. A portion of an inner surface 403 of the rear housing 4 corresponding to the first projecting portion 10c is also in the form of a planar surface. Thus, the outer surface 101 of the first projecting portion 10c of the heat sink 10 is arranged to be in surface contact with the inner surface 403 of the rear housing 4. A region (shown by diagonal lines in FIGS. 7 and 10) where the outer surface 101 of the planar first projecting portion 10c of the heat sink 10 and the inner surface 403 of the rear housing 4 are in surface contact with each other is arranged in the vicinity of the side of the rear housing 4 along arrow X2 to extend in the direction Z (short-side direction of the rear housing 4). Heat generated by the LED source 6a is radiated from the outwardly exposed region 401 of the rear housing 4 through the heat sink 10 along a heat radiation path A shown in FIG. 8.

As shown in FIGS. 8 and 9, the height (protrusion height with respect to the surface (rear surface) of the heat sink 10) H4 of the first projecting portion 10c is larger than the height (protrusion height with respect to the surface (rear surface) of the heat sink 10) H3 of the second projecting portions 10d of the heat sink 10. As shown in FIG. 9, surfaces 102 of the second projecting portions 10d are in the form of planar surfaces. According to this embodiment, rear housing mounting threaded holes 10e for mounting the rear housing 4 are formed on the surfaces 102 of the second projecting portions 10d. Recess portions 4d concaved toward the second projecting portions 10d of the heat sink 10 are formed on portions of the rear housing 4 corresponding to the rear housing mounting threaded holes 10e of the second projecting portions 10d of the heat sink 10. Screw receiving holes 4e for mounting screws 30 are formed in the recess portions 4d of the rear housing 4. The screws 30 are mounted on the rear housing mounting threaded holes 10e of the second projecting portions 10d of the heat sink 10 through the screw receiving holes 4e of the read housing 4, thereby fixing (pressure-welding) surfaces 404 of the recess portions 4d of the rear housing 4 along arrow Y1 and the surfaces 102 of the second projecting portions 10d of the heat sink 10 along arrow Y2 to each other in a state in surface contact with each other. Heat generated by the LED source 6a is radiated from the screws 30 and the outwardly exposed region 401 of the rear housing 4 through the heat sink 10 along a heat radiation path B shown in FIG. 9.

As shown in FIG. 6, screw receiving holes 91c for mounting the reflection sheet holders 9a and 9b are formed in the reflection sheet holder 9c. Reflection sheet holder mounting threaded holes 92a and 92b for mounting the reflection sheet holder 9c are formed on the right ends of the reflection sheet holders 9a and 9b respectively. Screws 30 are mounted on the reflection sheet holder mounting threaded holes 92a and 92b of the reflection sheet holders 9a and 9b through the screw receiving holes 91c of the reflection sheet holder 9c, thereby fixing the reflection sheet holders 9a and 9b and the reflection sheet holder 9c to each other.

As shown in FIGS. 4 and 6, screw receiving holes 92c for mounting the corresponding bezels 16 are formed on upper and lower end portions of the reflection sheet holder 9c respectively. Screws 30 are mounted on the bezel mounting threaded holes 93a and 93b formed on the right ends of the reflection sheet holders 9a and 9b through the screw receiving holes 16a of the bezels 16 and the screw receiving holes 92c on the upper and lower end portions of the reflection sheet holder 9c, thereby fixing the bezels 16 and the reflection sheet holders 9a, 9b and 9c to each other.

Figure 10:
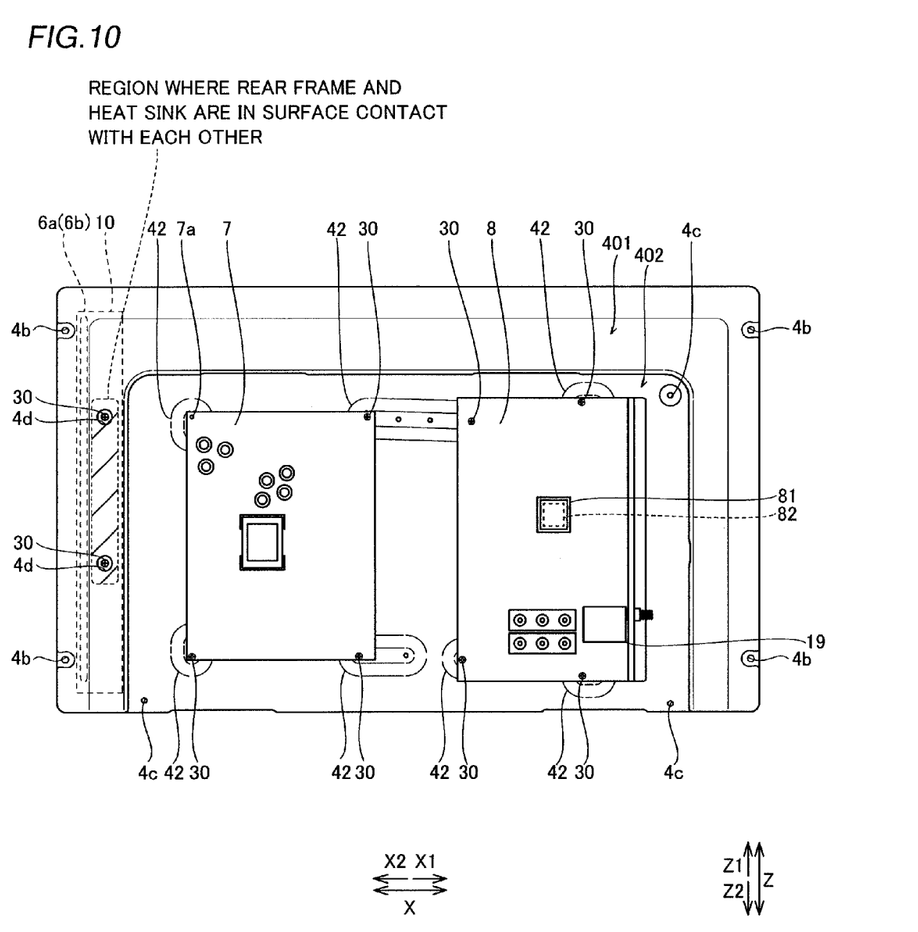
FIG. 10 is a back elevational view (rear elevational view) showing a rear housing, mounted with a circuit board, of the liquid crystal television set according to the embodiment of the present invention.

As shown in FIG. 10, the heating element 81 mounted on the circuit board 8 is mounted on the region 402 of the rear surface of the rear housing 4 covered with the cover member 5. The thermal pad 82 arranged between the circuit board 8 and the rear housing 4 is arranged to overlap with the heating element 81 of the circuit board 8 as viewed from behind. Further, the thermal pad 82 is formed to be smaller than the heating element 81 as viewed from behind.

Figure 11:
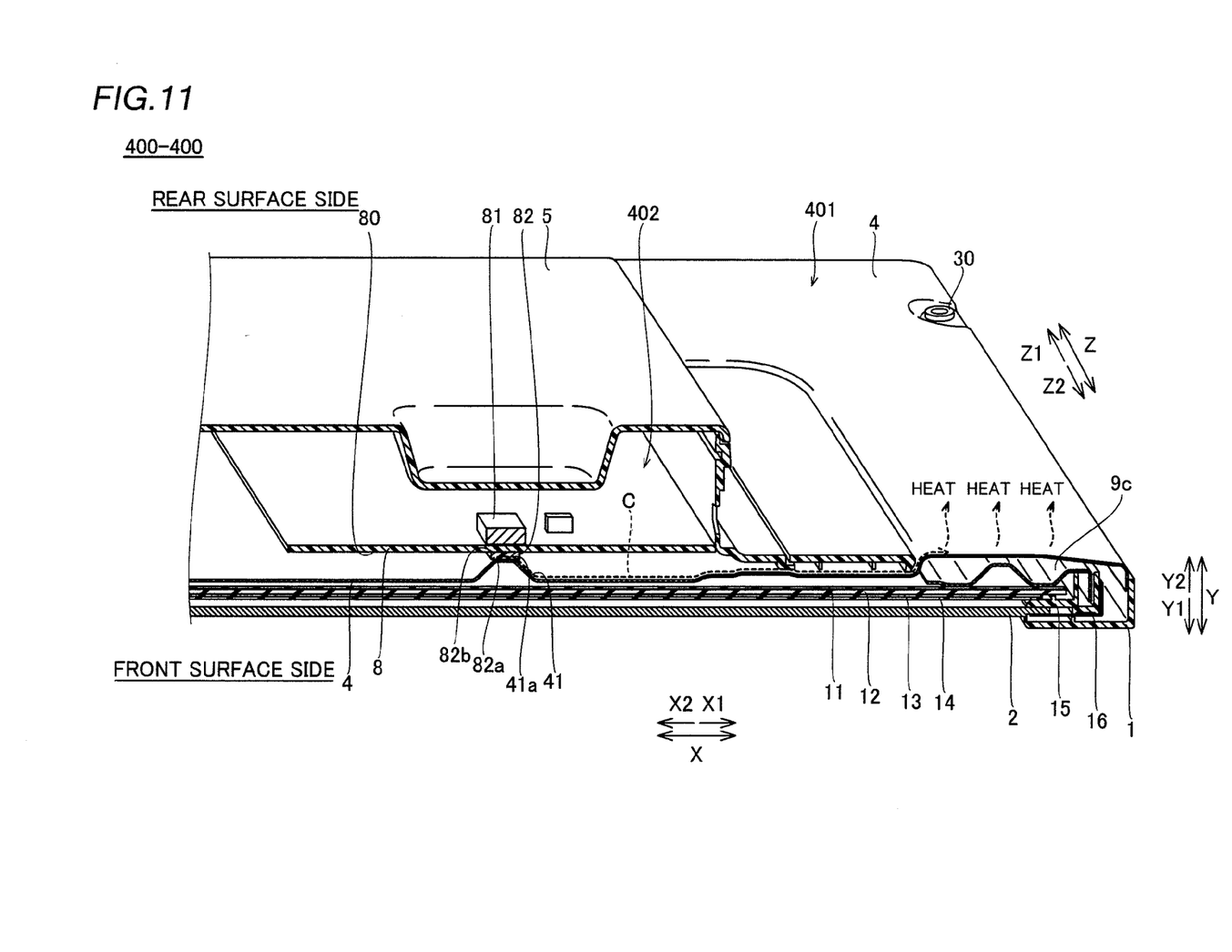
FIG. 11 is a perspective sectional view taken along the line 400-400 in FIG. 3.

As shown in FIGS. 11 and 12, a rear surface (along arrow Y2) 41a of the thermal pad mounting portion 41 of the rear housing 4 is in the form of a planar surface. Further, the rear surface 41a of the thermal pad mounting portion 41 of the rear housing 4 is formed to be in surface contact with a front surface (along arrow Y1) 82a of the thermal pad 82. A rear surface (along arrow Y2) 82b of the thermal pad 82 is arranged to be in surface contact with a front surface (along arrow Y1) 80 of the circuit board 8. Heat generated by the heating element 81 mounted on the circuit board 8 is radiated from the outwardly exposed region 401 of the rear housing 4 through the thermal pad 82 and the thermal pad mounting portion 41 of the rear housing 4 along a heat radiation path C shown in FIG. 11.

According to this embodiment, as hereinabove described, the heat sink 10 is arranged on the region corresponding to the region 401 of the rear housing 4 exposed outward from the cover member 5 as viewed from behind. Thus, the heat generated by the LED source 6a can be excellently radiated from the outwardly exposed region 401 of the rear housing 4 through the heat sink 10, dissimilarly to a case where the heat sink 10 is arranged on the region 402 of the rear housing 4 covered with the cover member 5 as viewed from behind. Further, the area of the region where the heat sink 10 is arranged can be reduced dissimilarly to a case where the heat sink 10 is arranged on a region substantially equal to the region where the rear housing 4 is arranged, for example. Consequently, the area of the region where the heat sink 10 is arranged can be reduced while excellently radiating the heat generated by the LED source 6a.

According to this embodiment, as hereinabove described, the heat sink 10 mounted with the LED source 6a is arranged on the region corresponding to the region 401 of the rear housing 4 exposed outward from the cover member 5 as viewed from the side of the rear surface of the rear housing 4. Thus, the distance between the LED source 6a mounted on the heat sink 10 and the outwardly exposed region 401 of the rear housing 4 can be relatively reduced, whereby the heat generated by the LED source 6a can be quickly radiated from the outwardly exposed region 401 of the rear housing 4 through the heat sink 10.

According to this embodiment, as hereinabove described, the surface 101 of the heat sink 10 closer to the rear housing 4 is arranged to be in surface contact with the inner surface 403 (404) of the rear housing 4. Thus, heat radiation can be more effectively performed as compared with a case where the surface 101 of the heat sink 10 closer to the rear housing 4 is arranged to be in point contact or in line contact with the inner surface 403 (404) of the rear housing 4.

According to this embodiment, as hereinabove described, both of the surface 101 of the first projecting portion 10c of the heat sink 10 and the portion of the inner surface 403 of the rear housing 4 corresponding to the surface 101 of the first projecting portion 10c are in the form of planar surfaces. Thus, the surface 101 of the first projecting portion 10c of the heat sink 10 and the portion of the inner surface 403 of the rear housing 4 corresponding to the surface 101 of the first projecting portion 10c can be easily brought into surface contact with each other.

According to this embodiment, as hereinabove described, the region where the surface 101 of the first projecting portion 10c of the heat sink 10 and the inner surface 403 of the rear housing 4 are in surface contact with each other is arranged in the vicinity of one side constituting the outer peripheral portion of the rectangularly formed rear housing 4 to extend along one side so that the region where the surface 101 of the first projecting portion 10c of the heat sink 10 and the inner surface 403 of the rear housing 4 are in surface contact with each other is arranged to extend along one side and the heat radiation area can be increased, whereby the heat radiation can be more effectively performed.

According to this embodiment, as hereinabove described, the surfaces 102 of the second projecting portions 10d of the heat sink 10 mounted with the screws 30 and the surfaces 404 of the recess portions 4d of the rear housing 4 mounted with the screws 30 are fixed to each other with the screws 30 in the surface-contact state so that the surfaces 102 of the second projecting portions 10d of the heat sink 10 and the surfaces 404 of the recess portions 4d of the rear housing 4 can be pressure-welded to each other in the surface-contact state, whereby heat can be rendered more easily conductible, and the heat radiation can be more effectively performed as a result.

According to this embodiment, as hereinabove described, all of the surfaces 102 of the second projecting portions 10d of the heat sink 10 and the surfaces 404 of the recess portions 4d of the rear housing 4 closer to the heat sink 10 are in the form of planar surfaces. Thus, the surfaces 102 of the second projecting portions 10d of the heat sink 10 and the surfaces 404 of the recess portions 4d of the rear housing 4 closer to the heat sink 10 can be easily brought into surface contact with each other.

According to this embodiment, as hereinabove described, the protrusion height H4 of the first projecting portion 10c with respect to the surface (rear surface) of the heat sink 10 is rendered larger than the projection height H3 of the second projecting portions 10d with respect to the surface (rear surface) of the heat sink 10. Thus, the surface 101 of the first projecting portion 10c of the heat sink 10 and the portion of the inner surface 403 of the rear housing 4 corresponding to the surface 101 of the first projecting portion 10c come into surface contact with each other on the vertical position higher than that of the second projecting portions 10d, whereby the surface 101 of the first projecting portion 10c of the heat sink 10 and the portion of the inner surface 403 of the rear housing 4 corresponding to the surface 101 of the first projecting portion 10c can be easily brought into surface contact with each other while pressure-welding the surfaces 102 of the second projecting portions 10d of the heat sink 10 and the surfaces 404 of the recess portions 4d of the rear housing 4 closer to the heat sink 10 to each other in the surface-contact state.

According to this embodiment, as hereinabove described, the backlight LED source 6a is so provided that the heat generated by the backlight LED source 6a can be excellently radiated from the outwardly exposed region 401 of the rear housing 4 through the heat sink 10.

According to this embodiment, as hereinabove described, the thermal pad 82 for radiating the heat generated by the heating element 81 of the circuit board 8 to the rear housing 4 is so provided that the heat generated by the heating element 81 can be easily radiated from the outwardly exposed region 401 of the rear housing 4 through the thermal pad 82 also when the circuit board 8 mounted with the heating element 81 is covered with the cover member 5.

According to this embodiment, as hereinabove described, the heat generated by the heating element 81 of the circuit board 8 covered with the cover member 5 is indirectly radiated from the outwardly exposed region 401 of the rear housing 4 through the thermal pad 82 and the thermal pad mounting portion 41 of the rear housing 4 so that the thickness of the thermal pad 82 can be reduced by the height of the thermal pad mounting portion 41 formed on the rear housing 4 and the heat generated by the heating element 81 is indirectly radiated from the outwardly exposed region 401 of the rear housing 4 through the thermal pad 82 and the thermal pad mounting portion 41 of the rear housing 4, whereby the heat generated by the heating element 81 can be easily radiated.

According to this embodiment, as hereinabove described, the surface 41a of the thermal pad mounting portion 41 closer to the circuit board 8 is in the form of a planar surface. Thus, the thermal pad 82 can be easily fixed by arranging the thermal pad 82 in the clearance between the surface 41a of the thermal pad mounting portion 41 closer to the circuit board 8 and the circuit board 8 to be held therebetween.

According to this embodiment, as hereinabove described, the protrusion height H1 of the board mounting portions 42 with respect to the rear surface of the rear housing 4 is rendered larger than the protrusion height H2 of the thermal pad mounting portion 41 with respect to the rear surface of the rear housing 4. Thus, the circuit board 8 is fixed on the vertical position higher than that of the thermal pad mounting portion 41, whereby the thermal pad 82 can be easily arranged in the clearance between the surface 41a of the thermal pad mounting portion 41 closer to the circuit board 8 and the circuit board 8 to be held therebetween.

According to this embodiment, as hereinabove described, the heat sink 10 and the rear housing 4 made of metal are so provided that the heat generated by the LED source 6a or the heating element 81 can be rendered easily conductible, whereby heat radiation efficiency can be improved.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to the liquid crystal television set as an example of the display (television set) according to the present invention in the aforementioned embodiment, the present invention is not restricted to this. The present invention is also applicable to another display such as a monitor of a personal computer other than the television set, or a television set other than the liquid crystal television set, for example.

While the heat sink for radiating the heat generated by the light source portion is arranged to extend along the direction Z (short-side direction) of the rear housing in the aforementioned embodiment, the present invention is not restricted to this. The heat sink may alternatively be arranged to extend along the long-side direction of the rear housing, for example, so far as the same is arranged on the region corresponding to the region of the rear housing exposed outward from the cover member as viewed from behind.

While the heat sink is arranged to extend along one side of the outer peripheral portion of the rear housing in the aforementioned embodiment, the present invention is not restricted to this. The heat sink may alternatively be arranged to extend along two, three or four sides of the outer peripheral portion of the rear housing, for example, so far as the same is arranged on the region corresponding to the region of the rear housing exposed outward from the cover member as viewed from behind. Also in this case, the area of the region where the heat sink is arranged can be reduced as compared with a case where the heat sink is provided on the overall surface of the rear housing. Further, heat radiation can be more effectively performed as compared with the case where the heat sink is arranged along one side of the outer peripheral portion of the rear housing.

While the heat sink and the rear housing made of sheet metal (SECC) are employed in the aforementioned embodiment, the present invention is not restricted to this. The heat sink or the rear housing may alternatively be made of a material, such as aluminum, for example, other than the sheet metal (SECC), so far as the same can radiate the heat generated by the LED source or the heat element.

While the thermal pad made of the mixed material of silicone polymer and ceramic or the like is employed as an example of the second heat radiation member in the present invention in the aforementioned embodiment, the present invention is not restricted to this. A heat radiation member other than the thermal pad made of the mixed material of silicone polymer and ceramic or the like may alternatively be employed, for example, so far as the same can radiate the heat generated by the LED source or the heat element.

What is claimed is:

1. A display comprising:
    a light guide member having a first surface and a second surface opposite to said first surface;
    a display portion positioned at a first side where said first surface exists on the basis of said light guide member;
    a light source portion positioned near an end portion of said light guide member;
    a housing positioned at a second side opposite to said first side where said second surface exists on the basis of said light guide member; and
    a first heat radiation member positioned between said light guide member and said housing and contacting with said light source portion;
    wherein said first heat radiation member includes a first contacting portion contacting with a portion of said second surface near said end portion of said light guide member at which said light source portion is positioned, a second contacting portion contacting with a portion of said second surface apart from said portion near said end portion of said light guide member at which said light source portion is positioned and a third contacting portion positioned between said first contacting portion and said second contacting portion and contacting with said housing,
    a recess portion is arranged between said third contacting portion and said second surface.

2. The display according to claim 1, further comprising a cover member positioned at an opposite surface side of said housing to a surface side at which said light guide member is positioned, and
    said light source portion is mounted on said first heat radiation member, and
    said first heat radiation member mounted with said light source portion is positioned at a region corresponding to a region of said housing exposed outward from said cover member as viewed from the surface side of said housing at which said cover member is positioned.

3. The display according to claim 1, wherein
    a surface of said third contacting portion is arranged to be in surface contact with an inner surface of said housing.

4. The display according to claim 3, wherein
    both of said surface of said third contacting portion and a portion of said inner surface of said housing corresponding to said surface of said third contacting portion are in the form of planar surfaces.

5. The display according to claim 3, wherein
    said housing is rectangularly formed, and so provided that a portion around an outer peripheral portion is exposed outward from said cover member, and
    a region where said surface of said third contacting portion and said housing are in surface contact with each other is arranged near one side constituting said outer peripheral portion of rectangularly formed said housing to extend along said one side.

6. The display according to claim 1, wherein
    said first heat radiation member has a fourth contacting portion contacting with said housing and mounted with a screw member,
    said housing has a recess portion concaved toward said fourth contacting portion and mounted with said screw member, and
    said fourth contacting portion and said recess portion are fixed to each other by said screw member in a state in surface contact with each other.

7. The display according to claim 6, wherein
    both of said surface of said fourth contacting portion of said first heat radiation member and said surface of said recess portion of said housing abutting on said first heat radiation member are in the form of planar surfaces.

8. The display according to claim 6, wherein
    a surface of said third contacting portion of said first heat radiation member is arranged to be in surface contact with said inner surface of said housing, and a protrusion height of said third contacting portion with respect to said second surface of said light guide member is larger than a protrusion height of said fourth contacting portion with respect to said second surface of said light guide member.

9. The display according to claim 1, wherein
said light source portion includes a backlight LED source.

10. The display according to claim 1, further comprising:
a circuit board mounted on a portion of said housing covered with said cover member, and
a second heat radiation member contacting with both said circuit board and said housing.

11. The display according to claim 10, wherein
a projecting portion protruding toward an inner surface of said cover member is formed on a region of said rear surface of said housing corresponding to said circuit board while said circuit board is arranged on a surface of said projecting portion through said second heat radiation member, and
the display is so formed that heat generated by said circuit board covered with said cover member is indirectly radiated from said outwardly exposed region of said housing through said second heat radiation member and said projecting portion of said rear housing.

12. The display according to claim 11, wherein
a surface of said projecting portion of said circuit board-side is in the form of a planar surface.

13. The display according to claim 11, wherein
said housing has a board mounting portion protruding toward said circuit board so that said circuit board is fixed thereto, and
a protrusion height of said board mounting portion with respect to said rear surface of said housing is larger than a protrusion height of said projecting portion with respect to said rear surface of said housing.

14. The display according to claim 1, wherein
said first heat radiation member and said rear housing are made of metal.

15. The display according to claim 1, wherein
said light source portion is so constituted that a plurality of light sources is arrayed along one side constituting an outer peripheral portion of said housing,
said first contacting portion and said second contacting portion extend substantially in parallel along an array direction of said plurality of light sources.

16. The display according to claim 15, wherein
said first contacting portion and said second contacting portion extend from a substantially central region of said light source portion to one side direction and other side direction along said array direction of said plurality of light sources.

17. The display according to claim 15, wherein
the length of said third contacting portion along said array direction of said plurality of light sources is less than the length of said light source portion.

18. The display according to claim 1, wherein
said recess portion has a shape tapered toward said second side.

19. A display comprising:
a light guide member having a first surface and a second surface opposite to said first surface;
a display portion positioned at a first side where said first surface exists on the basis of said light guide member;
a light source portion positioned near an end portion of said light guide member;
a housing positioned at a second side opposite to said first side where said second surface exists on the basis of said light guide member; and
a first heat radiation member positioned between said light guide member and said housing and contacting with said light source portion, wherein
said first heat radiation member includes a first contacting portion contacting with a portion of said second surface near said end portion of said light guide member at which said light source portion is positioned, a second contacting portion contacting with a portion of said second surface apart from said portion near said end portion of said light guide member at which said light source portion is positioned and a third contacting portion positioned between said first contacting portion and said second contacting portion and contacting with said housing,
at least one of said first contacting portion, said second contacting portion and said third contacting portion has a shape tapered toward respective contacting edge of said first contacting portion, said second contacting portion or said third contacting portion.

* * * * *